United States Patent [19]

Kindell

[11] 4,337,404

[45] Jun. 29, 1982

[54] APPARATUS FOR FIRING SERIES-CONNECTED THYRISTORS

[75] Inventor: Bo Kindell, Västerås, Sweden

[73] Assignee: ASEA Aktiebolag, Västerås, Sweden

[21] Appl. No.: 105,479

[22] Filed: Dec. 20, 1979

[30] Foreign Application Priority Data

Dec. 22, 1978 [SE] Sweden .............................. 78132362

[51] Int. Cl.³ .......................................... H03K 17/72
[52] U.S. Cl. ................................ 307/252 L; 323/270; 323/271; 363/68
[58] Field of Search ............... 307/252 L, 252 Q, 264, 307/268; 328/66, 67; 323/268, 271, 270; 363/67, 68

[56] References Cited

U.S. PATENT DOCUMENTS

| | | | |
|---|---|---|---|
| 3,530,357 | 9/1970 | Leowald | 307/252 L |
| 3,596,168 | 7/1971 | Hengsberger | 307/252 L |
| 3,772,532 | 11/1973 | Petrov et al. | 307/252 L |

FOREIGN PATENT DOCUMENTS

1638378 9/1975 Fed. Rep. of Germany .
363940 2/1974 Sweden .

OTHER PUBLICATIONS

G.E. SCR Manual, Fifth Edition, pp. 61–63.

*Primary Examiner*—John Zazworsky
*Attorney, Agent, or Firm*—Pollock, Vande Sande & Priddy

[57] ABSTRACT

An apparatus for simultaneously firing a plurality of series-connected thyristors having a control pulse transformer for each thyristor. Each transformer has first and second primary windings, with the first windings being connected in series with each other, and the series combination being connected through an auxiliary thyristor to a capacitor which is charged from a DC voltage source. The second primary windings are also connected in series with each other with the series combination being connected to a DC source through a transistor switch means. In half of the transformers the two primary windings have the same polarities, while in the other half they have opposite polarities. To fire the thyristors, the auxiliary thyristor is caused to be fired causing the transformers to provide a steep pulse with a high amplitude to the thyristors. At the end of the initial pulse, the transistor switch means is activated and the transformers thereafter deliver a continuous control current having a lower amplitude to the thyristors.

9 Claims, 2 Drawing Figures

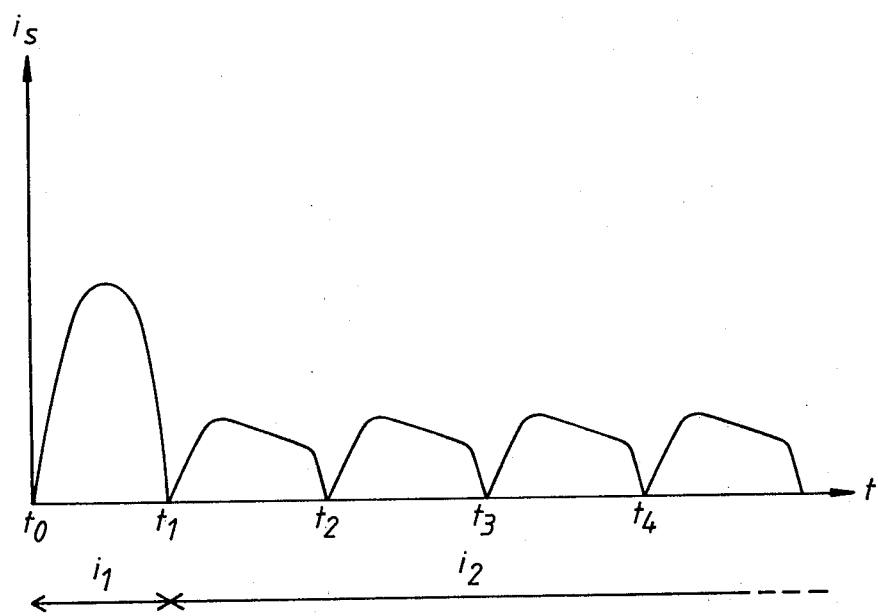

APPARATUS FOR FIRING SERIES-CONNECTED THYRISTORS

FIELD OF THE INVENTION

The present invention relates to an apparatus for simultaneously firing a plurality of series-connected thyristors which utilizes a plurality of control pulse transformers having series-connected primary windings which are connected to a voltage source and having secondary windings which are connected to the control electrodes of the thyristors. The transformers are connected in a circuit which causes them to provide a steep and brief control current pulse with high amplitude to the thyristors for firing as well as a continuous control current having a lower amplitude for maintaining the thyristors in the conducting state.

BACKGROUND OF THE INVENTION

It is known that a single thyristor may be fired rapidly and safely and with a moderate demand for control power by first supplying the thyristor with an initial control pulse with high amplitude and steepness upon firing, and thereafter supplying the thyristor with a continuous control current with lower amplitude. The initial pulse results in rapid and safe firing and the subsequent lower-amplitude control current maintains the thyristor in the conducting state with a moderate demand for control power. The technique may also be used for simultaneous firing of a plurality of, for example, series-connected thyristors. In this case, the high and steep initial pulse ensures a rapid, reliable and simultaneous firing of the thyristors independent of the variation of the firing properties of the thyristors and of inevitable differences in the parameters of the firing circuits of the individual thyristors.

In equipment of the above-mentioned type, a number of control pulse transformers, typically one for each thyristor, are arranged with their primary windings series-connected and connected to a control current source. The secondary windings of the transformers are connected through rectification means to control electrodes of the thyristors. The control current source may comprise a capacitor which is charged to a relatively high voltage, and which is connected, typically through a transistor switch means, to the series-connected primary windings to provide the required initial pulse. After the end of the initial pulse, the transistor switch means, is pulsed with relatively high frequency so that a pulsed direct current from a current source with lower amplitude is fed through the primary windings of the control pulse transformers. After being transformed to the secondary windings, this current after rectification is supplied to the control electrodes of the thyristors and constitutes the continuous control current which flows after the initial pulse.

However, as the number of series-connected thyristors becomes greater, the required voltage for the initial pulse becomes so high that a transistor is not suitable for use as a switching element. While the use of a thyristor for this element is theoretically possible, as a practical matter it is unsuitable because among other things, the use of a thyristor would require special turn-off circuits to effect the necessary pulsing of the primary current after the end of the initial pulse.

German Auslegeschrift No. 1638378 discloses an arrangement in which each of a plurality of series-connected thyristors is provided with two control pulse transformers, one of which provides the short and steep initial pulse and the other of which provides the subsequent continuous control current. In one embodiment of this arrangement, the thyristors are provided with separate control current sources and separate switching members for triggering the control pulses. This type of circuit is complicated and expensive and does not guarantee simultaneous firing of the individual thyristors. In another embodiment, the primary windings of the transformers which transmit the initial pulse are connected in series across a first voltage source and a first switching element, and the primary windings of the transformers which transmit the continuous control current are connected in series across a second voltage source and a second switching element. However, if a large number of series-connected thyristors are used, both of the switching elements must be thyristors because of the high voltage required, which then results in the above-mentioned disadvantages. Further, if the control pulse transformers are designed in a known manner as high voltage cables having cores fitted on them, two cables are required, one for the initial pulse and one for the continuous control current, which is expensive as well as requiring an excessive amount of space.

The Swedish published patent application No. 363,940 discloses a firing circuit in which the parallel combination of a thyristor and a transistor is connected in series with a voltage source and the primary winding of a control pulse transformer. The thyristor is first fired and triggers the initial pulse, whereupon the transistor is switched into the conducting state and carrys the continuous control current. However, since the transistor, which cannot handle voltages of high magnitude, is subjected to the same voltage as the thyristor, this arrangement can only be used for a relatively small number of series-connected thyristors.

BRIEF SUMMARY OF THE INVENTION

It is therefore an object of the present invention to provide an apparatus for providing a steep initial control pulse of short duration and high amplitude followed by a continuous control current, to a large number of series-connected thyristors.

It is a further object of the invention to achieve rapid and reliable firing of a large number of series-connected thyristors.

It is still a further object of the invention to accomplish the above objects with a relatively simple circuit arrangement.

The above objects are accomplished by providing a plurality of control pulse transformers having first and second primary windings. The first primary windings are connected in series with each other and are connected across a first voltage source through a first switching means. The second primary windings are also connected in series with each other, and are connected across a second voltage source through a second switching means. The secondary windings of the transformer are connected to the control electrodes of the thyristors.

In a preferred embodiment the first switching means is an auxiliary thyristor and the second switching means is a transistor switch means. When it is desired to fire the series-connected thyristors, a control signal is initiated, which results in the firing of the auxiliary thyristor. A capacitor is provided which forms a series oscillation circuit together with the leakage inductances of the control pulse transformers. Upon firing of the auxiliary thyristor, this circuit performs half a cycle of an oscillation, at the end of which the current through the first primary windings becomes zero and tends to change its direction, whereupon the auxiliary thyristor receives a reverse blocking voltage and is extinguished.

Means are provided for detecting the reverse blocking voltage, whereupon a signal is provided to turn the transistor switch means on, which causes the continuous control current of lower amplitude to flow through the second primary windings of the transformer.

BRIEF DESCRIPTION OF THE DRAWINGS

The invention will be better understood by referring to the accompanying drawings in which:

FIG. 2 is a graphical drawing which depicts the control current of the thyristors as a function of time.

Referring to FIG. 1, a plurality of series-connected thyristors, TY1-TY-4, which are fired by the arrangement of the invention are shown. The thyristors may, for example, be included in a static convertor or in a static switch for connection or disconnection of a load and to/from an AC voltage network. Each thyristor is connected to a control pulse transformer and it is significant to note that the control pulse transformer $T_1$ which is associated with the thyristor TY1 has two primary windings L11 and L12, while the secondary winding of the transformer has two halves, L13 and L14. The secondary current of the transformer is full-wave rectified by means of diodes D11 and D12 and is supplied in the form of control current is to the control electrode of the thyristor TY1. The thyristors TY2, TY3 and TY4 are associated with corresponding control pulse transformers T2, T3 and T4, which are designed in the same way as the transformer T1 and the secondary windings of which are connected in the same way via full-wave rectifying diodes to the control electrodes of the respective thyristors.

Figure 1:
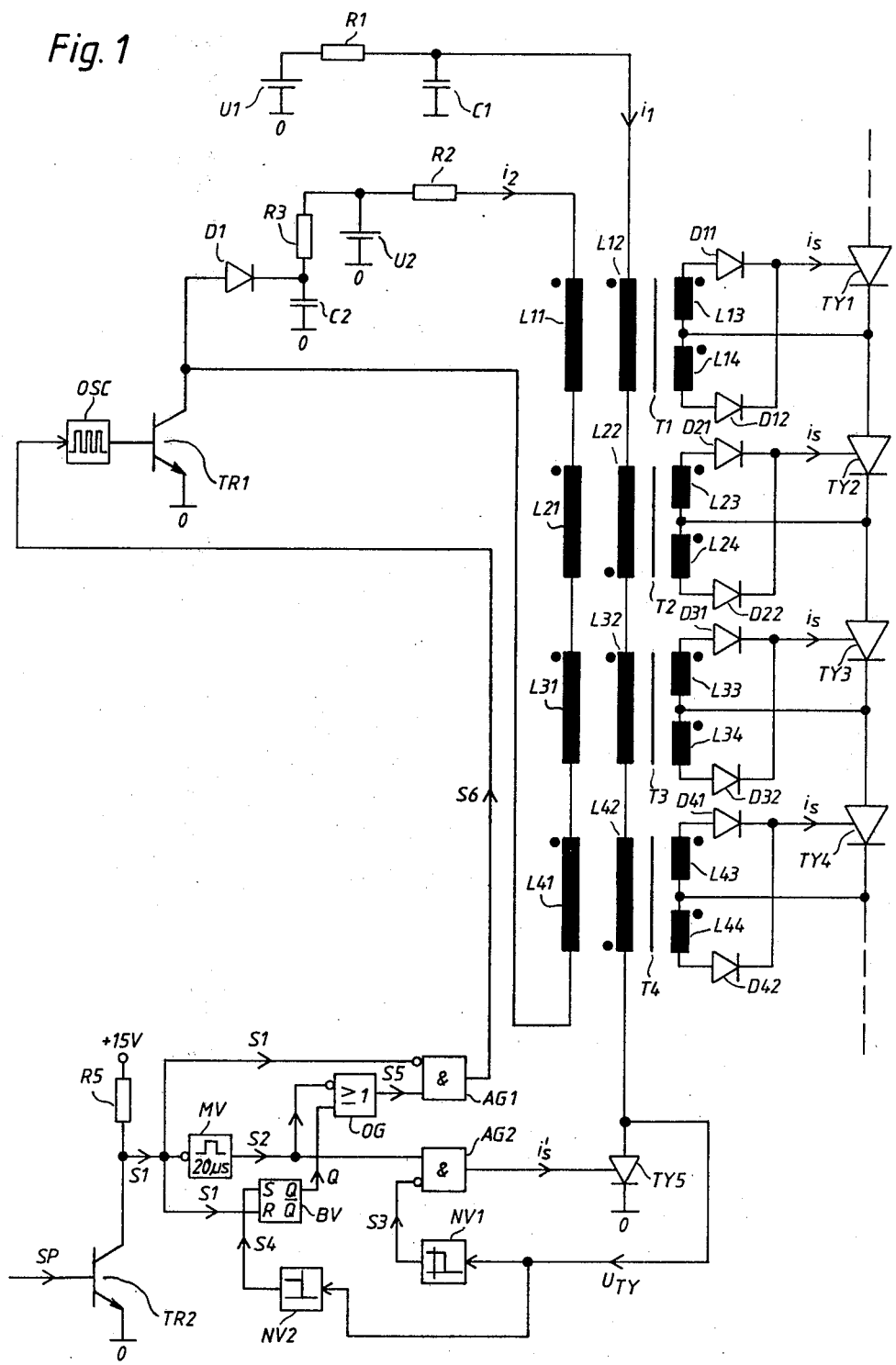
FIG. 1 is a circuit diagram of an embodiment of the invention.

For the sake of clarity only four series-connected thyristors are shown in the figure, but in a typical case the number of thyristors and therefore the number of control pulse transformers may be considerably greater, for example, ten or twenty.

The first windings L12, L22, L32 and L42 are connected in series with each other to a capacitor C1, which serves as the voltage source for the initial pulse. The capacitor is charged from a DC voltage source U1 through a resistor R1 and the source voltage and the resistance are adjusted so that the capacitor C1 may be charged to the necessary voltage, for example 500 V, during the interval between two consecutive firings of the series-connected thyristors.

An auxiliary thyristor TY5 is connected in series with the first primary windings L12-L42. Upon the firing of TY5, the capacitor C1 is discharged through the primary windings, and the desired steep, high amplitude initial pulse of the control current is supplied to the thyristors TY1-TY4. Further, the combination of capacitor C1 and the leakage inductances of the control pulse transformers form a series oscillation circuit. Upon firing of thyristor TY5, this circuit performs half a cycle of an oscillation, and when at the end of the half cycle the current $i_1$ through the primary windings L12-L42 becomes zero and tends to change its direction, the thyristor TY5 receives reverse blocking voltage and is extinguished. The capacitance of the capacitor C1 and the leakage inductances of the control pulse transformers are preferably chosen so that the natural frequency of the oscillating circuit formed by these components corresponds to a period of 10–20 $\mu$s. In this case, the initial pulse, which constitutes half a cycle of an oscillation of the circuit, will have a duration of 5–10 $\mu$s.

The second primary windings L11–41 of the control pulse transformers are connected in series with each other and with a transistor switch means TR1, to a DC voltage source U2 having an exemplary voltage of 200 V. A resistor R2 is connected in series with the second primary windings and is selected so that a direct current of a suitable magnitude is supplied to the windings from the voltage source U2. The transistor TR1 is controlled periodically on-off by an oscillator OSC which delivers drive current pulses of high frequency, for example 50 kHz, to the transistor. The current $i_2$ through the primary windings L11, L21, L31, L41 therefore becomes a high-frequency pulsating direct current. This current is transformed over to the secondary windings of the control pulse transformers and after being full-wave rectified, constitutes the continuous control current with lower amplitude which follows after the initial pulse. The control current during this stage consists of a full-wave rectified alternating current with such a high frequency that it is equivalent to a fully continuous direct current for thyristor control.

The oscillator OSC is preferably activated at approximately the same time that the initial pulse ends, so that the initial pulse is directly followed by the continuous control current. However, it is not necessary that the oscillator be activated immediately following the end of the control pulse.

Each time that the transistor TR1 is made non-conducting the current $i_2$ tends to continue flowing because of the transformer inductances. During this stage $i_2$ flows through diode D1 to capacitor C2, which may be discharged to the voltage source U2 through a resistor R3. A counter-voltage is therefore built up across the capacitor C2 and results in de-magnetization of the control pulse transformers during the non-conducting interval of the transistor TR1. At the same time, the transistor is protected from inductive overvoltages which may be caused by interruptions of the current $i_1$.

As is clear from the figure, the primary windings of control pulse transformers T1 and T3 have the same polarities, while the primary windings of transformers T2 and T4 have opposite polarities. In this way, the steep, high-amplitude initial pulse is prevented from causing an overtransformed voltage in the series connection of the primary windings L11–L41. This is because the voltages which are transformed over to these windings will alternately have opposite polarities, and the voltages cancel each other. In this way the initial pulse does not unduly stress the transistor TR1, which is essential to the dimensioning of the transistor and which is often a pre-requisite for being able to use a transistor in the first place.

The thyristor TY5 is controlled, possibly through an amplifier, from an AND gate circuit AG2. This gate is supplied with the output signal from a monostable circuit MV which, when its input signal becomes "0", emits a "1" pulse (the signal S2) with a duration of, for example, 20 $\mu$s. A level flip-flop NV1 is supplied with the anode voltage $U_{TY}$ of the thyristor TY5. If $U_{TY}$ is greater than a predetermined amount, for example 90 V, the output signal S3 of the flip-flop is "0", while otherwise it is "1". The signal S3 is supplied to an inverting input of the AND gate circuit AG2. If both S2=1 and S3=0, AG2 delivers a control pulse $i_s'$ to the thyristors TY5.

The voltage $U_{TY}$ is supplied to a second level flip-flop NV2. The output signal S4 of this flip-flop, which is "0" if $U_{TY} \geq 0$ and "1" if $U_{TY} < 0$, is supplied to the S input of a bistable circuit BV. The output signal Q from this circuit is supplied to an OR circuit OG. An inverting input of this circuit is supplied with the output signal S2 from the monostable circuit MV.

The input signal S1 of the monostable circuit MV is obtained from the point of connection between a resistor R5 connected to positive direct voltage (+15 V) and a transistor TR2 connected to ground (0). If the transistor is in the conducting state, S1=0, and if the transistor is in the non-conducting state S1=1. The signal S1 is supplied to the R-input of the bistable circuit BV, and the signal is also supplied to an inverting input of an AND gate circuit AG1. A second input of this circuit is supplied with the output signal S5 from the OR circuit OG. The output signal S6 of the AND gate circuit is supplied to the control input of the oscillator OSC, which is turned on if S6 is "1".

The firing of the thyristors TY1-TY5 is controlled by a control signal SP, as follows. At $t=t_0$, SP switches from "0" to "1". The transistor TR2 becomes conducting, and the signal S1 becomes "0". This causes the monostable circuit MV to emit a short (20 $\mu$s) "1" pulse. The thyristor TY5 is non-conducting and therefore has a high anode voltage, and the output signal S3 of the flip-flop NV1 is "0". As soon as SP and therefore S2 become "1", the AND gate circuit AG2 provides a control current $i_s'$ to the thyristor TY5, which starts the above-described initial pulse. As soon as the thyristor has ignited, $U_{TY}$ becomes low. The output signal S3 of the flip-flop NV1 then becomes "1" and the AND circuit AG2 stops delivering control current to the thyristor TY5.

The flip-flop BV is set to "0", and since therefore the signal Q is "0" and the signal S2 is "1", the output signal S5 from the OR circuit OG is "0", which is also the case with the output signal S6 from the AND circuit AG1. The oscillator OSC is therefore still inactive and the transistor TR1 is non-conducting.

As soon as the initial pulse has performed a half cycle of its oscillation the thyristor TY5 becomes extinguished and receives reverse blocking voltage, that is $U_{TY}$ becomes negative. This occurs at $t=t_1$ in FIG. 2. The signal S4 then becomes "1", causing the Q output of the flip-flop BV to become "1". This causes the signal S5 to become "1", and since S1 is "0", the signal S6 becomes "1". This causes the oscillator OSC to turn on and a continuous control current is supplied in the manner described above to the thyristors TY1-TY4. This current consists of full-wave rectified half cycles of a square wave alternating current and is shown in FIG. 2, in the time intervals $t_1$-$t_2$, $t_2$-$t_3$, and so on. Because of the excitation current in the control pulse transformers as well as other factors, the half cycles are somewhat deformed.

Thus, as shown in FIG. 2, the initial pulse of the control current $i_s$ which is caused by the current $i_1$ through the primary windings L12-L42, flows between $t=t_0$ and $t=t_1$, and the continuous control current, caused thereafter by the current $i_2$ through the primary windings L11-L41 begins flowing at $t=t_1$.

If for some reason, the thyristor TY5 should not fire and an initial pulse is therefore not provided, the oscillator OSC is still turned on. Thus, after 20 $\mu$s has elapsed from the time that SP became "1", S2 becomes "0" and S5 and S6 become "1", thus turning on the oscillator.

When it is desired to turn the thyristors TY1-TY4 off, the control signal SP is set to "0". The signal S1 then becomes "1" and the signal S6 becomes "0" turning the oscillator OSC off, and turning off the supply of ignition current to the thyristors. When S1 becomes "1", the Q output of flip-flop BV is set to "0".

As described above, the primary windings in half of the control pulse transformers (T1,T3) have the same polarities and in the other half of the transformers (T2,T4) have opposite polarities. In this way the two primary circuits (C1, L12-L42, TY5 and U2, R2, L11-L41, TR1, respectively) are arranged to have no influence on each other. However, in general it is not necessary that the windings in exactly half of the transformers have the same polarities and in the other half opposite polarities. It may even be an advantage if a greater number of the transformers have windings with the same polarities than have windings with opposite polarities. The voltages induced to windings L12-L42 from windings L11-L41 will then give a resultant voltage which extinguishes the thyristor TY5 if the normal extinction for some reason fails to take place.

It should be noted that the natural frequency of the circuit C1-L12-L22-L32-L42 may, if desired, be changed by an expedient such as connecting an additional inductor in series with the primary windings L12-L42.

In an alternative embodiment of the invention, the transistor (TR1) may be used to provide the initial pulse for example by means of a capacitor discharge, as well as the continuous control current through the primary windings (L11-L41). In this embodiment the thyristor (TY5) is used to obtain a very rapid protective firing of the thyristors of the valve (TY1-TY4). This is attained because a trigger signal, for example in case of overvoltage, can be forwarded directly to the thyristor (TY5) while avoiding the circuits which control the normal firing. Further, in this embodiment the capacitor (C1) which constitutes the voltage source for the rapid firing may at all times be maintained fully charged and prepared for immediate firing.

While the invention has been described in connection with certain preferred embodiments, it should be understood that it is not intended to be restricted thereto, but rather to cover all variations, modifications, and uses which come within the spirit of the invention, which is limited only by the claims appended hereto.

I claim:

1. In an apparatus for simultaneously firing a plurality of series-connected thyristors, wherein a plurality of control pulse transformers are provided having series-connected primary windings which are connected to a voltage source and having secondary windings which are connected to the control electrodes of the thyristors, the apparatus being arranged to provide a steep control current pulse having a short duration and a high amplitude to the thyristors as well as a continuous control current with a lower amplitude, the improvement wherein each control pulse transformer has first and second primary windings, with the first primary windings of the transformers being connected in series with each other and the series combination being connected across a first voltage source through a first switching means and the second primary windings also being connected in series with each other and the series combination being connected across a second voltage source through a second switching means and further including means for activating said first switching means for providing said steep control current pulse through said first primary windings and means for activating said second switching means for providing said continuous control current with lower amplitude through said second primary windings.

2. Apparatus according to claim 1 wherein said first voltage source consists of a capacitor which is charged from a DC voltage source.

3. Apparatus according to claim 1, wherein said first switching means comprises a thyristor.

4. Apparatus according to claim 1, wherein said second switching means comprises a transistor.

5. Apparatus according to claim 1, wherein said control pulse transformers consist of two groups and wherein in one said group the first and second primary windings of each transformer have the same polarities, while in the second group the first and the second primary windings of each transformer have opposite polarities.

6. Apparatus according to claim 5, wherein the number of transformers in said one group is substantially equally as great as the number of transformers in the said second group.

7. Apparatus according to claim 1 wherein said first switching means is arranged to activate before said means for activating said second switching means activates said second switching means so that said short initial current pulse is provided before said control current of lower amplitude.

8. Apparatus according to claim 2, in which the capacitor together with the inductance of the circuit comprising said primary windings constitutes an oscillating circuit, and wherein said means for activating said second switching means is arranged to effect said activation after half a cycle of the oscillating circuit has elapsed.

9. Apparatus according to claim 8, in which the first switching means comprises a thyristor and wherein said means for activating said second switching means comprises means for sensing when the thyristor receives reverse blocking voltage and for activating said second switching means in response thereto.

* * * * *